United States Patent
Grassl et al.

(10) Patent No.: US 8,041,528 B2
(45) Date of Patent: Oct. 18, 2011

(54) ARRANGEMENT FOR CALIBRATING A VECTOR NETWORK ANALYZER

(75) Inventors: Martin Grassl, Bad Feilnbach (DE); Anton Lindner, Munich (DE); Reimer Nagel, Feldkirchen-Westerham (DE); Michael Lege, Bruckmuehl (DE)

(73) Assignee: Spinner GmbH, Munich (DE)

( * ) Notice: Subject to any disclaimer, the term of this patent is extended or adjusted under 35 U.S.C. 154(b) by 411 days.

(21) Appl. No.: 12/403,943

(22) Filed: Mar. 13, 2009

(65) Prior Publication Data

US 2009/0234610 A1 Sep. 17, 2009

(30) Foreign Application Priority Data

Mar. 13, 2008 (DE) .......................... 10 2008 014 039

(51) Int. Cl.
*G01R 35/00* (2006.01)
*G06F 19/00* (2011.01)

(52) U.S. Cl. ......... 702/85; 324/74; 324/76.52; 324/601; 702/117; 702/182

(58) Field of Classification Search .................... 702/33, 702/35, 85, 107, 117, 119, 120, 182, 183, 702/187; 324/74, 76.52, 601; 356/73.1
See application file for complete search history.

(56) References Cited

U.S. PATENT DOCUMENTS

| | | | | |
|---|---|---|---|---|
| 5,175,492 A | * | 12/1992 | Wong et al. ...................... | 324/74 |
| 5,587,934 A | * | 12/1996 | Oldfield et al. .................. | 702/85 |
| 5,715,183 A | * | 2/1998 | Grace et al. ..................... | 702/85 |
| 6,300,775 B1 | * | 10/2001 | Peach et al. .................... | 324/601 |
| 6,529,844 B1 | * | 3/2003 | Kapetanic et al. .............. | 702/85 |
| 7,054,776 B2 | * | 5/2006 | Bradley et al. ................ | 702/107 |
| 7,268,530 B1 | * | 9/2007 | Verspecht .................. | 324/76.52 |

* cited by examiner

*Primary Examiner* — John H Le
(74) *Attorney, Agent, or Firm* — Edell, Shapiro & Finnan, LLC

(57) ABSTRACT

An arrangement for calibrating a vector network analyzer (VNA) is substantially secure against operating errors and offers cost-effective calibration by connecting calibration components. Each calibration component includes a transponder and a non-volatile memory which contains, as non-changeable data, at least the type of the component and an individual identification number and, as changeable data, at least the number of calibration processes performed with this calibration component. The VNA includes a wireless interface for reading at least the non-changeable data of a respective calibration component and for incrementing the stored number of the calibration processes performed with this calibration component.

7 Claims, 4 Drawing Sheets

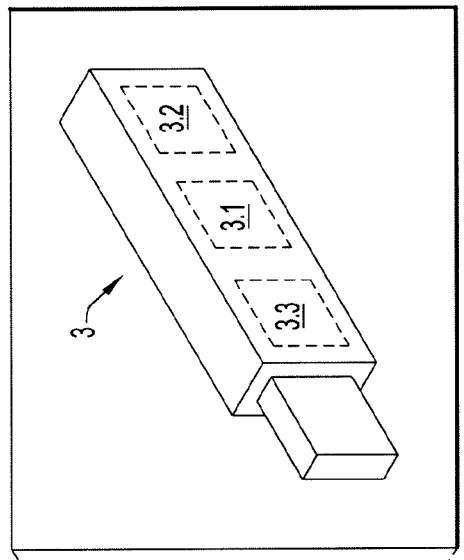
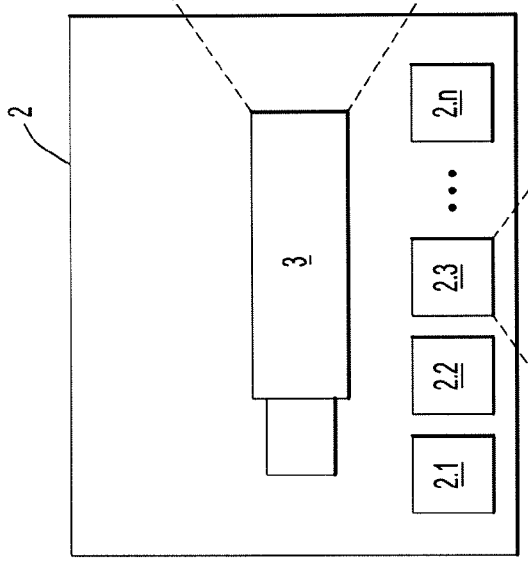
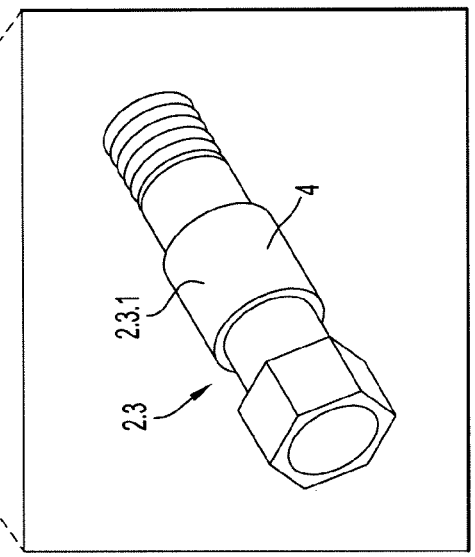

ARRANGEMENT FOR CALIBRATING A VECTOR NETWORK ANALYZER

CROSS REFERENCE TO RELATED APPLICATIONS

This application claims priority under 35 U.S.C. §119 to Application No. DE 102008014039.2 filed on Mar. 13, 2008, entitled "An Arrangement for Calibrating a Vector Network Analyzer," the entire contents of which are hereby incorporated by reference.

FIELD OF THE INVENTION

The invention relates to an arrangement for calibrating a software-controlled vector network analyzer (VNA).

BACKGROUND

The components of a vector network analyzer (VNA) have amplitude and phase-frequency characteristics over the frequency which requires a new calibration especially in the case of changes in the measuring frequency range, the send amplitude and/or the measuring lines. Calibration components with known properties are used for calibration. The different calibration components, of which the most frequent are known as short, open, load and through, jointly form a calibration set. The respective calibration component, which hereinafter is referred to in short as "component," is connected with the respective measuring port or ports of the VNA. This is followed by the actual calibration process, which is usually menu-guided. This kind of calibration by hand is susceptible to errors by confusing the calibration components.

Electronic calibration modules are available as alternatives which contain the calibration data (i.e., the characteristic data) as stored values and are connected in respect of radio frequency with the measuring ports and via a data line with data interface of the VNA. Although the numerous contact rearrangement processes of the manual calibration are avoided and their risk of an erroneous calibration is reduced substantially, the costs of such electronic calibration modules are very high.

SUMMARY

The invention relates to an arrangement for calibrating a software-controlled vector network analyzer (VNA) by connecting at least one calibration component from a set of calibration components with the VNA which treats the calibration component as a measuring object in a calibration mode, with error terms being calculated from its measured actual values and from its characteristic data saved to a memory of the VNA and measuring results being output which are corrected in the measuring mode for connected measuring objects according to the error terms.

The arrangement, according to an embodiment of the present invention, comprises a vector network analyzer, a set of calibration components configured to connect to the VNA, and a wireless interface for wirelessly communicating between the VNA and a respective one of the calibration components connected to the VNA. The VNA is configured, in a calibration mode, to treat a connected calibration component as a measuring object, and calculate error terms from actual measured values and characteristic data of the connected component saved to a memory of the VNA and, in a measuring mode, to output measuring results which are corrected for connected measuring objects according to the error terms. Each calibration component comprises a transponder with a non-volatile memory which contains, as non-changeable data, at least the type of the component and an individual identification number and, as changeable data, at least the number of calibration processes performed with this calibration component. The wireless interface is configured to read at least the non-changeable data from the respective calibration component and increment the stored number of the calibration processes performed with the respective calibration component.

The above and still further features and advantages of the present invention will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The arrangement for calibrating a vector network analyzer (VNA) is explained by reference to an example according to an embodiment of the invention shown in the drawings in a schematically simplified way and to flow charts, where:

FIG. 3A shows a calibration set including a read/write module and a calibration component;

FIG. 3B shows a perspective view of the read/write module of FIG. 3A;

FIG. 3C shows a perspective view of one of the calibration components of FIG. 3A;

DETAILED DESCRIPTION

Figure 1:
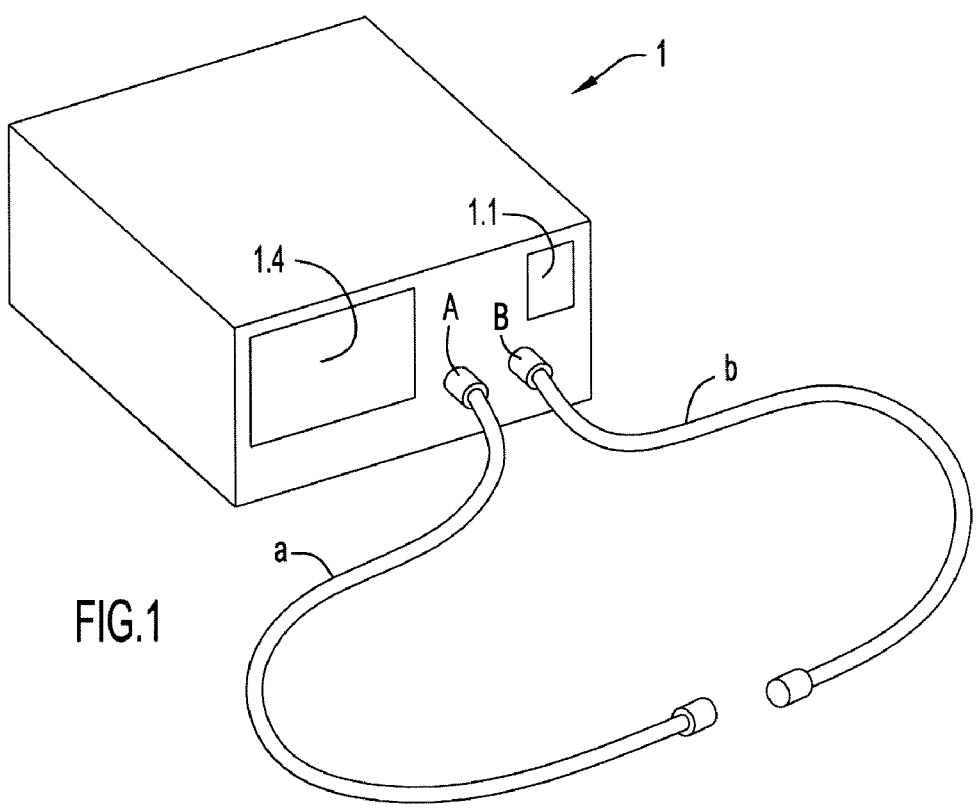
FIG. 1 shows a vector network analyzer (VNA)

The invention is based on the object of providing an arrangement of the kind described above which in comparison with manual calibration is both more time-saving and error-proof, and is substantially more cost-effective in comparison with automated calibration.

This object is achieved in accordance with the invention in such a way that each calibration component comprises a transponder with a non-volatile memory which contains, as non-changeable data, at least the type of the component and an individual identification number and, as changeable data, at least the number of calibration processes performed with this calibration component. Furthermore, the VNA comprises a wireless interface for reading at least the non-changeable data of the respective calibration component and for incrementing the stored number of the calibration processes performed with this calibration component.

The control of the communication between the wireless interface of the VNA and the transponder of the respective calibration component is performed via the microprocessor of the VNA.

When the transponder of a component is read, the microprocessor compares the read-out non-changeable data with the stored data and with the presettings of the VNA set by the user or establishes such presettings automatically. The changeable data read from the component is processed by the microprocessor and written back to the transponder. Consequently, erroneous operations (e.g., inadvertently connecting an open, in the event that a short is preset, the use of a non-permitted component, the use of a component whose number of permissible uses or its permissible time of use has been exceeded, etc.) are excluded. Accordingly, the calibration with the arrangement, according to an embodiment of the invention, is time-saving and offers increased security in handling in comparison with a conventional manual calibration. At the same time, it is more cost-effective in comparison with an automatic calibration via a complex electric calibration module, because it is performed via calibration components similar to the conventional calibration components. By comparison to conventional calibration components, calibration components according to an embodiment of the present invention are each equipped or retrofitted with a transponder. In other words, each calibration component, according to an embodiment of the present invention, comprises a transponder.

According to an embodiment of the present invention, the VNA cuts off the wireless interface (i.e., terminates communication between the VNA and a connected calibration component) after reading the data of the calibration component and the incrementing of the stored number of calibration processes. Therefore, it is ensured that the communication (e.g., via radio frequency) between the interface and the transponder of the component, allowing for recognition of the component and transmission of its data, does not distort the subsequent calibration process which is highly susceptible to interference.

The wireless interface may comprise a wireless read/write module configured to connect to the VNA via a plug-in connection. Such read/write modules which work on the basis of a standardized communication protocol (e.g., USB protocol) frequently implemented in VNAs for example are commercially available.

The wireless interface may be configured to communicate with the VNA via its existing data bus.

The above-mentioned characteristic data of the respective calibration component can concern coefficients known to the person skilled in the art (e.g., the offset length, their line losses, polynomial coefficients of the inductivity (for the short), the capacitance (for the open), etc.). The characteristic data may also include the complete and very extensive data record of the S-parameters of the respective calibration component.

Furthermore, the non-volatile memory of the transponder of each calibration component may also contain its characteristic data which is then read via the wireless interface and is saved to the memory of the VNA for calculating the error terms. When the memory space in the transponder is limited, the characteristic data may only include the coefficients described above. If the memory space is sufficient to receive the extensive S-parameter data record, the characteristic data may further include this data record.

In the embodiment in which the wireless interface comprises a wireless read/write module that can be connected to the VNA, the characteristic data can also be saved to a non-volatile memory of the read/write module. In this case, the read/write module is an integral component of the set of calibration components and contains the characteristic data of all calibration components of this record in a non-volatile memory. When reading the non-changeable data (i.e., read-only data) of a specific calibration component, at least its characteristic data are read from the non-volatile memory of the read/write module and saved to the memory of the VNA for calculating the error terms. This optional embodiment of the present invention may be useful in cases where the calibration components are equipped with inexpensive transponders which offer relatively little memory space, but where the VNA will be calibrated via the S-parameter data records and the components.

The microprocessor of the VNA may also be configured (e.g., via a program) to read, evaluate and display the data of each calibration component. Thus, it can be determined how many further calibration processes the respective component may permissibly be used.

The invention is now described in further detail in relation to exemplary embodiments as depicted in FIGS. 1-5.

FIG. 1 shows a vector network analyzer (VNA) according to an embodiment of the present invention. Similar to a conventional VNA, the VNA 1 of the present invention as shown in FIG. 1, whose control elements on the front side have been omitted, comprises a measuring port A with a connected measuring line (a) and a measuring port B with a connected measuring line (b). Various calibration components according to an embodiment of the present invention can be connected at first to the plug-in connections at the end of the measuring lines (a) and (b) in the calibration cycle and, after the completed calibration, the respective measuring objects can be connected. The VNA 1, according to an embodiment of the present invention, further comprises a data interface 1.1 (e.g., a USB connection). The VNA may further comprise a screen display 1.4.

Figure 2:
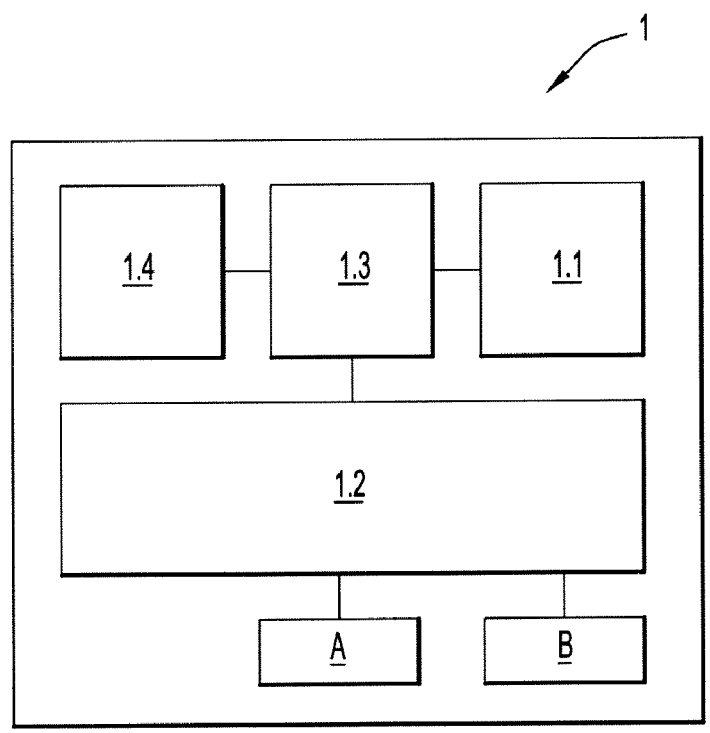
FIG. 2 shows a block diagram of the measuring system of the VNA.

FIG. 2 shows a simplified block diagram of the basic arrangement of a VNA. The measuring ports A and B are used for connecting the measuring objects of the complex measuring circuit 1.2 which, for brevity, will not be discussed in great detail in terms of the invention and which is controlled by a microprocessor 1.3 which is connected with the screen display 1.4 indicated in FIG. 1 as well as with the data interface 1.1.

FIG. 3A shows a calibration set 2, according to an embodiment of the present invention, which comprises a read/write module 3 in addition to the calibration components 2.1, 2.2, 2.3, . . . 2.n. The read/write module 3, as shown in FIG. 3B, may for example have the shape of a conventional USB stick with a conventional communication circuit (not shown), a short range transmitter/receiver 3.1 with an antenna 3.2 (e.g., a loop antenna), which transmitter/receiver can be switched off by the VNA, and optionally a non-volatile memory 3.3 in which are stored the identification numbers of all calibration components 2.1 to 2.n, their characteristic data and an identification number of the calibration set 2, depending on the embodiment.

All calibration components 2.1 to 2.n are similar to conventional calibration components and differ from the respective known calibration components in that they further comprise additional parts including a transponder 4 (e.g., RFID transponder). These additional parts with the transponder 4 are fastened in a non-detachable way to the calibration component. In addition, these parts may include an antenna, if necessary. FIG. 3C shows a perspective view of a calibration component 2.3 according to an embodiment of the present invention. It is assumed in the example shown in FIG. 3C that the component 2.3 concerns a through. The transponder 4 is enclosed by sleeve 2.3.1 in which an RFID transponder 4 is embedded which is connected with several wire windings as an antenna (not shown) which are also embedded in the sleeve 2.3.1. The RFID transponder 4 includes a memory chip which is arranged as a non-volatile memory and comprises an area for a non-changeable identification number, an area for the type of component and an area for the non-changeable calibration data. The memory chip further comprises a writable area which is used as a cycle counter, which is incremented by one unit by the read/write module 3 in the case of each time the component is used.

Figure 4:
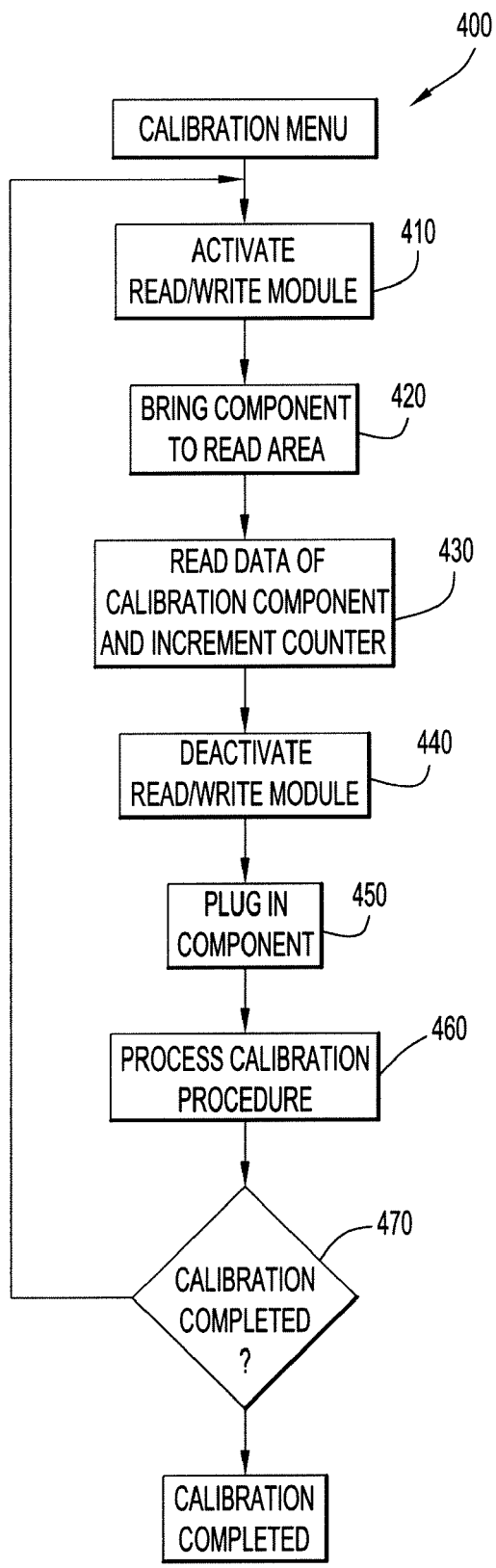
FIG. 4 shows a flow chart for a calibration process.

FIG. 4 illustrates the sequence of a calibration cycle 400. At step 410, the read/write module is activated. At step 420, a selected component is brought to the read area (e.g., held in close proximity to the read/write module). The step 420 "bring component to read area" is due to the fact that the range of the RF connection between the read/write module 3 connected with the VNA 1 and the transponder 4 of the respective component is intentionally limited to a few centimeters in order to minimize the irradiation of RF interferences to directly adjacent measuring places and to avoid simultaneous read-out of several components. At step 430, the data of the calibration component is read and the counter is incremented. The step 440 of "deactivating read/write module" is of particular importance, because this step eliminates the risk of the RF communication link distorting the calibration process. At step 450, the calibration component is plugged in. At step 460, the calibration procedure is processed. At 470, it is determined whether the calibration is complete. If the calibration is not complete, the cycle is continued until the calibration is determined to be complete.

Figure 5:
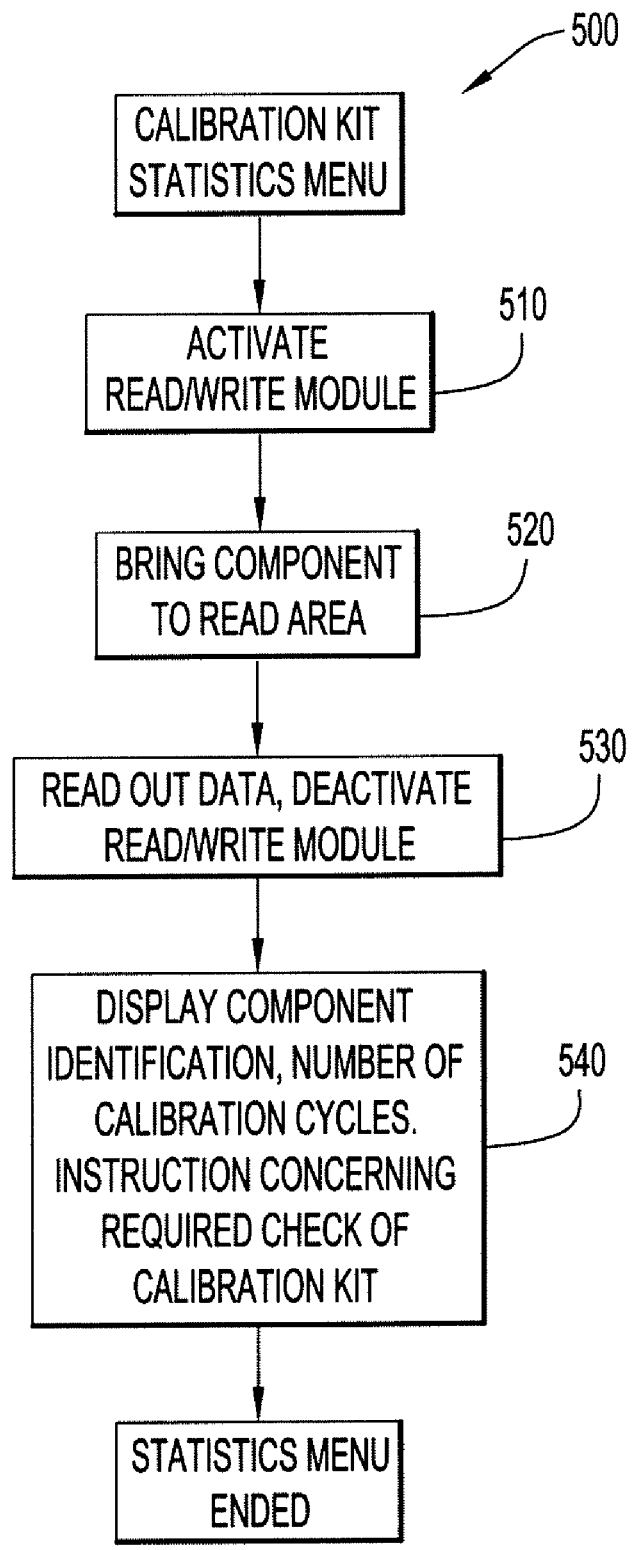
FIG. 5 shows a flow chart for producing a statistics protocol of a component.

FIG. 5 illustrates the generation process 500 of a component-related statistics report. At step 510, the read/write module is activated. At step 520, a selected calibration component is brought to the read area (e.g., held in close proximity to the read/write module). At step 530, data is read from the selected calibration component and the read/write module is deactivated. At step 540, the data is displayed (e.g., component identification, the number of calibration cycles the selected component has undergone, etc.). Furthermore, instructions concerning required check of the calibration kit may be displayed.

While the invention has been described in detail with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. An arrangement for calibrating a software-controlled vector network analyzer (VNA), comprising:
a vector network analyzer (VNA) configured, in a calibration mode, to treat a connected calibration component as a measuring object, and calculate error terms from actual measured values and characteristic data of the connected component saved to a memory of the VNA and, in a measuring mode, to output measuring results which are corrected for connected measuring objects according to the error terms;
a set of calibration components configured to connect to the VNA, each calibration component comprising a transponder with a non-volatile memory which contains, as non-changeable data, at least the type of the component and an individual identification number and, as changeable data, at least the number of calibration processes performed with this calibration component; and
a wireless interface for wirelessly communicating between the VNA and a respective one of the calibration components connected to the VNA, the wireless interface being configured to read at least the non-changeable data from the respective calibration component and increment the stored number of the calibration processes performed with the respective calibration component.

2. The arrangement according to claim 1, wherein the wireless interface is further configured to cut off wireless communication in response to the data of the calibration component being read and the stored number of calibration processes being incremented.

3. The arrangement according to claim 1, wherein the wireless interface comprises a wireless read/write module configured to connect to the VNA via a plug-in connection.

4. The arrangement according to claim 3, wherein the read/write module is an integral component of the set of calibration components and contains the characteristic data of all calibration components of the set in a non-volatile memory of the read/write module, the read/write module being further configured, when reading the non-changeable data of a selected calibration component, to read and save the corresponding characteristic data to the memory of the VNA for calculating the error terms.

5. The arrangement according to claim 1, wherein the wireless interface is further configured to communicate with the VNA via a data bus of the VNA.

6. The arrangement according to claim 1, wherein the non-volatile memory of the transponder of each calibration component further contains its characteristic data and the wireless interface is further configured to read and save the characteristic data of a connected calibration component to the memory of the VNA for calculating the error terms.

7. The arrangement according to claim 1, wherein the VNA is configured to read, evaluate and display the data of each calibration component.

* * * * *